(12) United States Patent
Ciccarelli et al.

(10) Patent No.: US 9,287,886 B2
(45) Date of Patent: Mar. 15, 2016

(54) DYNAMIC REFERENCE FREQUENCY FOR FRACTIONAL-N PHASE-LOCKED LOOP

(75) Inventors: Steven C. Ciccarelli, San Diego, CA (US); Frederic Bossu, San Diego, CA (US); Vladimir Aparin, San Diego, CA (US); Kevin H. Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 785 days.

(21) Appl. No.: 12/366,441

(22) Filed: Feb. 5, 2009

(65) Prior Publication Data
US 2009/0221235 A1 Sep. 3, 2009

Related U.S. Application Data

(60) Provisional application No. 61/032,944, filed on Feb. 29, 2008.

(51) Int. Cl.
*H04B 1/40* (2015.01)
*H03L 7/197* (2006.01)

(52) U.S. Cl.
CPC .................... *H03L 7/1974* (2013.01)

(58) Field of Classification Search
CPC ...... H04B 1/109; H04B 1/525; H04B 1/1027; G01S 7/36; G01S 13/90; G01S 19/36; G01S 7/2813
USPC .............................. 455/76, 260; 327/156, 158
See application file for complete search history.

(56) References Cited

U.S. PATENT DOCUMENTS

| 4,987,571 | A | | 1/1991 | Haymond et al. |
| 5,329,253 | A | * | 7/1994 | Ichihara .......................... 331/17 |
| 5,694,089 | A | | 12/1997 | Adachi et al. |
| 5,732,329 | A | | 3/1998 | Miyazaki |

(Continued)

FOREIGN PATENT DOCUMENTS

| CN | 1083996 A | 3/1994 |
| CN | 1190504 A | 8/1998 |

(Continued)

OTHER PUBLICATIONS

International Search Report and Written Opinion—PCT/US2009/035577—ISA/EPO—Jul. 22, 2009.

(Continued)

*Primary Examiner* — Diana J Cheng
(74) *Attorney, Agent, or Firm* — Rupit M. Patel

(57) ABSTRACT

Within a receiver, the frequency of a comparison reference clock signal supplied to a fractional-N Phase-Locked Loop (PLL) is dynamically changed such that undesirable reciprocal mixing of reference spurs with known jammers (for example, transmit leakage) is minimized. As the transmit channel changes within a band, and as the transmit leakage frequency changes, a circuit changes the frequency of the comparison reference clock signal such that reference spurs generated by the PLL are moved in frequency so that they do not reciprocally mix with transmitter leakage in undesirable ways. In a second aspect, the PLL is operable either as an integer-N PLL or a fractional-N PLL. In low total receive power situations, the PLL operates as an integer-N PLL to reduce receiver susceptibility to fractional-N spurs. In a third aspect, jammer detect information is used to determine the comparison reference clock signal frequency.

32 Claims, 12 Drawing Sheets

(56) References Cited

U.S. PATENT DOCUMENTS

| | | |
|---|---|---|
| 5,872,487 A | 2/1999 | Adachi et al. |
| 5,878,033 A | 3/1999 | Mouly |
| 6,246,336 B1 | 6/2001 | Hymel |
| 6,252,543 B1 | 6/2001 | Camp |
| 6,256,509 B1 | 7/2001 | Tanaka et al. |
| 6,505,052 B1 | 1/2003 | Jou |
| 6,600,917 B1 | 7/2003 | Maupin |
| 6,606,502 B1 | 8/2003 | Chung Kam Chung et al. |
| 6,621,356 B2 * | 9/2003 | Gotz et al. ............ 331/25 |
| 6,671,500 B2 | 12/2003 | Damgaard et al. |
| 6,694,129 B2 * | 2/2004 | Peterzell et al. ............ 455/76 |
| 6,775,259 B1 | 8/2004 | Ranta |
| 6,778,521 B1 | 8/2004 | Korpela et al. |
| 6,785,324 B1 * | 8/2004 | Schultz et al. ............ 375/219 |
| 6,895,249 B2 | 5/2005 | Gaal |
| 2002/0132597 A1 | 9/2002 | Peterzell et al. |
| 2004/0228431 A1 | 11/2004 | Kramer et al. |
| 2005/0080564 A1 | 4/2005 | Tso et al. |
| 2006/0046663 A1 | 3/2006 | Yu |
| 2008/0039042 A1 | 2/2008 | Ciccarelli et al. |

FOREIGN PATENT DOCUMENTS

| | | |
|---|---|---|
| CN | 200980068 Y | 11/2007 |
| JP | S6221332 A | 1/1987 |
| JP | S63257339 A | 10/1988 |
| JP | S63299620 A | 12/1988 |
| JP | 1240020 A | 9/1989 |
| JP | 1270418 A | 10/1989 |
| JP | 4372233 A | 12/1992 |
| JP | 5122063 A | 5/1993 |
| JP | H0631240 U | 4/1994 |
| JP | H06268551 A | 9/1994 |
| JP | 7015391 A | 1/1995 |
| JP | 8186520 A | 7/1996 |
| JP | 8223037 A | 8/1996 |
| JP | 9008694 A | 1/1997 |
| JP | 9331255 A | 12/1997 |
| JP | 11252009 A | 9/1999 |
| JP | 11331070 A | 11/1999 |
| JP | 2002518684 A | 6/2002 |
| JP | 2002217726 A | 8/2002 |
| JP | 2002544728 | 12/2002 |
| JP | 2003249853 A | 9/2003 |
| JP | 2004207824 A | 7/2004 |
| JP | 2005192018 A | 7/2005 |
| JP | 2006074756 A | 3/2006 |
| JP | 2007259122 A | 10/2007 |
| JP | 2013042522 A | 2/2013 |
| TW | I318048 | 12/2009 |
| TW | I332764 | 11/2010 |
| WO | WO9966342 A1 | 12/1999 |

OTHER PUBLICATIONS

TIA/EIA Standard "Position determination service standard for dual mode spread spectrum systems" Nov. 1999, pp. 1-131.

Taiwan Search Report—TW098106507—TIPO—Sep. 24, 2012.

* cited by examiner

INTEGER-N PHASE-LOCKED LOOP

FRACTIONAL-N PHASE-LOCKED LOOP

INTEGER-N PLL CHARACTERISTIC

FRACTIONAL-N PLL CHARACTERISTIC

| INPUTS | | | | OUTPUT | | | |
|---|---|---|---|---|---|---|---|
| TOTAL RECEIVE POWER (dBm) | C/N BELOW THRESH ? | JAMMER DETECTED AT RX FREQ ? | TRANSMIT CHANNEL CENTER FREQ (MHz) (1.5MHz WIDE) | PLL CONTROL [0:2] | FRAC OR INT ? | XO FREQ (MHz) | COMP. REF. CLOCK FREQ (MHz) |
| < -90 | X | X | X | 0 00 | INT | 19.2 | 19.2 |
| > -90 | X | NO | 1719 | 1 00 | FRAC | 19.2 | 19.2 |
| > -90 | NO | YES | 1719 | 1 00 | FRAC | 19.2 | 19.2 |
| > -90 | YES | YES | 1719 | 1 01 | FRAC | 19.2 | 16.8 |
| > -90 | X | X | 1728 | 1 01 | FRAC | 19.2 | 16.8 |
| > -90 | X | X | 1742 | 1 10 | FRAC | 19.2 | 21.6 |
| > -90 | X | X | 1748 | 1 10 | FRAC | 19.2 | 21.6 |

PLL CONTROL LOOKUP TABLE

FIG. 8

COMPARISON REF CLOCK FREQUENCY = 16.8 MHZ $3XOI = (D2 \otimes D4).D12 + (D6 \otimes D8).D2 + (D10 \otimes D12).D8$ $4XOI = (D1 \otimes D2).D8 + (D3 \otimes D4).D2 + (D5 \otimes D6).D4 + (D7 \otimes D8).D6$ $7XOI = (D1 \otimes D2).D12 + (D3 \otimes D4).D14 + (D5 \otimes D6).D2 + (D7 \otimes D8).D4 + (D9 \otimes D10).D6 +$
$(D11 \otimes D12).D8 + (D13 \otimes D14).D10$ ⊗ REPRESENTS THE XOR OPERATION
\+ REPRESENTES THE OR OPERATION
· REPRESENTS THE AND OPERATION

DYNAMIC REFERENCE FREQUENCY FOR FRACTIONAL-N PHASE-LOCKED LOOP

CROSS-REFERENCE TO RELATED APPLICATION

This application claims the benefit under 35 U.S.C. §119 of Provisional Application Ser. No. 61/032,944, filed Feb. 29, 2008, said provisional application is incorporated herein by reference.

BACKGROUND INFORMATION

1. Technical Field

The disclosed embodiments relate to Phase-Locked Loops (PLL) within local oscillators of receivers.

2. Background Information

A direct conversion receiver of a cellular telephone typically employs a mixer that mixes a Local Oscillator (LO) signal with a desired high frequency signal such that the desired high frequency signal is downconverted to a lower baseband frequency. A local oscillator circuit generates the LO signal. A local oscillator circuit typically involves employing a crystal oscillator circuit and a Phase-Locked Loop (PLL) circuit. The crystal oscillator circuit outputs a stable and fixed reference clock signal (XO). The PLL receives the signal XO and outputs the local oscillator signal LO that is in turn supplied to the mixer. The PLL allows the frequency of the LO signal to be changed so that the receiver can be tuned to downconvert a desired high frequency signal of interest. The receiver is tuned by changing the frequency of the LO signal.

Historically there have been two types of PLLs used in local oscillator circuits. One of the PLLs is referred to here as an "integer-N PLL". The other of the PLLs is referred to here as a "fractional-N PLL". FIG. 1 (Prior Art) is a simplified diagram of an integer-N PLL 1. A crystal oscillator 2 generates a very stable crystal oscillator output signal XO. The crystal oscillator may or may not be considered part of the phase-locked loop. The XO signal is frequency divided by a divider 3 to generate a very stable reference signal of fixed frequency referred to here as the "comparison reference clock signal" 4. The divisor by which divider 3 divides may, for example, have a different value depending on the band in which the receiver is to receive. A high frequency VCO output signal LO output by VCO 5 is divided down in frequency by a loop divider 6 to generate a divided down feedback signal 7. The feedback signal 7 is compared to the very stable comparison reference signal 4 by a phase detector 8. The error signal output by phase detector 8 passes through a charge pump 9 and a loop filter 10. Loop filter 10 supplies a current or voltage steering signal 11 to VCO 5 such that feedback signal 7 is phase-locked with respect to the comparison reference clock signal 4. The frequency of the LO signal can be changed by changing the integer divisor by which loop divider 6 frequency divides to LO signal to generate the feedback signal 7. The local oscillator signal LO generated by such an integer-N PLL generally exhibits a relatively large amount of phase noise. As the PLL operates, the frequency of the signal LO varies and is controlled within a frequency band determined by the bandwidth of loop filter 10.

As cellular telephones have come to be used for purposes other than just voice communication, cellular telephones are to be able to receive at higher and higher data rates. In order to increase data rates, it is generally true that phase noise of the LO must be reduced. It is therefore desired to use a PLL in the local oscillator circuit of the cellular telephone receiver that exhibits less phase noise than does the traditional integer-N PLL of FIG. 1.

FIG. 2 (Prior Art) is a diagram of a second type of PLL employed today in local oscillators of receivers of cellular telephones. This second type of PLL is referred to here as a "fractional-N" Phase-Locked Loop (PLL). Fractional-N PLL 12 involves a modulator 13 that changes the divisor by which the loop divider 14 divides. The divisor is changed such that over time the average frequency of the feedback signal 15 frequency and phase matches the frequency and phase of comparison reference clock signal 16. In a fractional-N PLL, the frequency of the comparison reference clock signal 16 can be higher, so there is no divider that divides down the frequency of the XO signal output by the crystal oscillator 17. Because a higher comparison reference clock signal frequency can be used, the loop filter can have a higher loop bandwidth. Increasing loop bandwidth typically suppresses phase noise. The fractional-N PLL topology therefore can be used to generate local oscillator signals that have less phase noise as compared to local oscillator signals that would be generated using the integer-N PLL topology.

Unfortunately, in some receiver applications, use of a fractional-N PLL has drawbacks as compared to use of an integer-N PLL. As a PLL operates, the steering signal supplied to the VCO changes as a function of the frequency of the comparison reference clock signal. This changing of the steering signal results in changes in the frequency of the LO signal. These changes evidence themselves in the frequency domain as harmonic frequency components around the center frequency of the LO signal. These harmonic frequency components are referred to as "spurs."

FIG. 3 (Prior Art) is a diagram that illustrates an operational characteristic of the integer-N PLL 1 of FIG. 1. The Local Oscillator signal (LO) does not appear as a single ideal spike in the frequency domain but rather is pictured having skirts. The width of this skirt represents the phase noise that is present along with the LO signal itself. A desired high frequency signal is received on the antenna of the receiver and makes its way to the mixer of the receiver. The local oscillator signal LO supplied to the mixer is of such a frequency that the desired receive (RX) signal is downconverted in frequency to a baseband signal. Reference numerals 20-23 identify some of the spurs that are generated due to the steering of the VCO 5 in the integer-N PLL of FIG. 1. Note that the frequency separation between the spurs is FC1, the frequency of the comparison reference clock signal in the PLL of FIG. 1. Due to the relatively low frequency of the comparison reference clock signal in the integer-N PLL, the spurs are relatively close together and drop off in magnitude relatively rapidly such that there are effectively no spurs in the frequency channel 24. In the cellular telephone considered here, the transmitter of the cellular telephone may be transmitting at the same time that the receiver of the cellular telephone is receiving. The transmit frequency channel 24 is therefore separated in frequency from the frequencies of the desired RX signal. The double S symbols 25 in the diagram of FIG. 3 illustrate a large break in frequency. The frequency of the transmit channel is therefore separated in the frequency domain from the receive channel by a significant amount. As can be seen from the diagram of FIG. 3, the integer-N PLL generates an undesirable amount of phase noise.

FIG. 4 (Prior Art) is a diagram that illustrates an operational characteristic of the fractional-N PLL 12 of FIG. 2. Due to the greater loop bandwidth of the fractional-N PLL, the width of the skirt of the local oscillator signal LO in FIG. 4 is smaller than the width of the skirt of the local oscillator signal LO in FIG. 3. The fractional-N PLL exhibits less phase noise. Note, however, that the harmonic spurs components 26-28 are separated from one another in the frequency domain by the frequency FC2 of the comparison reference clock signal 16 in the fractional-N PLL 12 of FIG. 2. Frequency separation FC2 in the diagram of FIG. 4 is greater than frequency separation FC1 in the diagram of FIG. 3. Due to the greater frequency separation FC2 between harmonic spur components, the spurs of FIG. 4 do not drop off in magnitude as quickly as a function of frequency as do the spurs of FIG. 3. Such a spur 28 may therefore be of such a magnitude and such a frequency that it can reciprocally mix with transmitter leakage 24. Such reciprocal mixing may cause the mixer to downconvert the transmitter leakage to the baseband such that the downconverted transmitter leakage signal obscures the downconverted desired RX signal being received. This is undesirable. Use of the fractional-N PLL provided improved phase noise but unfortunately left the receiver susceptible to reciprocal mixing problems.

SUMMARY

The local oscillator of a receiver (such as the receiver of a full-duplex transceiver of a cellular telephone) includes a source of a stable reference signal (for example, a crystal oscillator), a Programmable Comparison Reference Clock Signal Generator (PCRCSG), and a Phase-Locked Loop (PLL). The PLL is configurable to operate in a fractional-N mode or in an integer-N mode. The PCRCSG is controllable to change the frequency of a comparison reference clock signal supplied to the PLL.

In one aspect, the frequency of the comparison reference clock signal is dynamically changed such that undesirable reciprocal mixing of reference spurs (generated by the PLL) with known jammers (for example, transmit leakage) is minimized. As the transmit channel changes within a band, and as the frequency of the transmit leakage changes, a circuit changes the frequency of the comparison reference clock signal as a function of the transmit channel frequency such that reference spurs generated by the fractional-N PLL are at frequencies that do not reciprocally mix with transmitter leakage in undesirable ways.

In a second aspect, the PLL is operated in the integer-N mode in low total receive power situations. In the low total receive power situations, the signal-to-noise ratio of the receiver is dominated by noise other than PLL-generated phase noise. Using the configurable PLL in its low phase noise mode (the fractional-N mode) therefore does not reduce noise and is not necessary. By operating the configurable PLL in the integer-N mode, however, reference spurs that would otherwise be generated by the PLL are not generated, thereby reducing susceptibility of the receiver to reciprocal mixing problems due to reference spurs.

In a third aspect, jammer detect information is used to determine the comparison reference clock signal frequency. If, for example, a jammer is detected by a jammer detect circuit within the receiver, then in response to the detecting the frequency of the comparison reference clock signal is changed. By changing the frequency of the comparison reference clock signal, potential problems (for example, problems due to unknown or unpredictable mechanisms) may be avoided. In some embodiments, receiver operation in a given operational situation is assessed using multiple different PLL configurations. These assessments are then used to determine how the PLL will be configured in future receiver operational situations.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 8 is a table that illustrates a PLL control lookup function. In a first aspect, the frequency of the comparison reference clock signal 214 of the PLL of FIG. 7 is determined based at least in part on transmit channel information. In a second aspect, the PLL is operated in an integer-N mode if the total receive power is below a predetermined threshold. In a third aspect, PLL configuration is determined based at least in part on jammer detect information.

DETAILED DESCRIPTION

Figure 5:
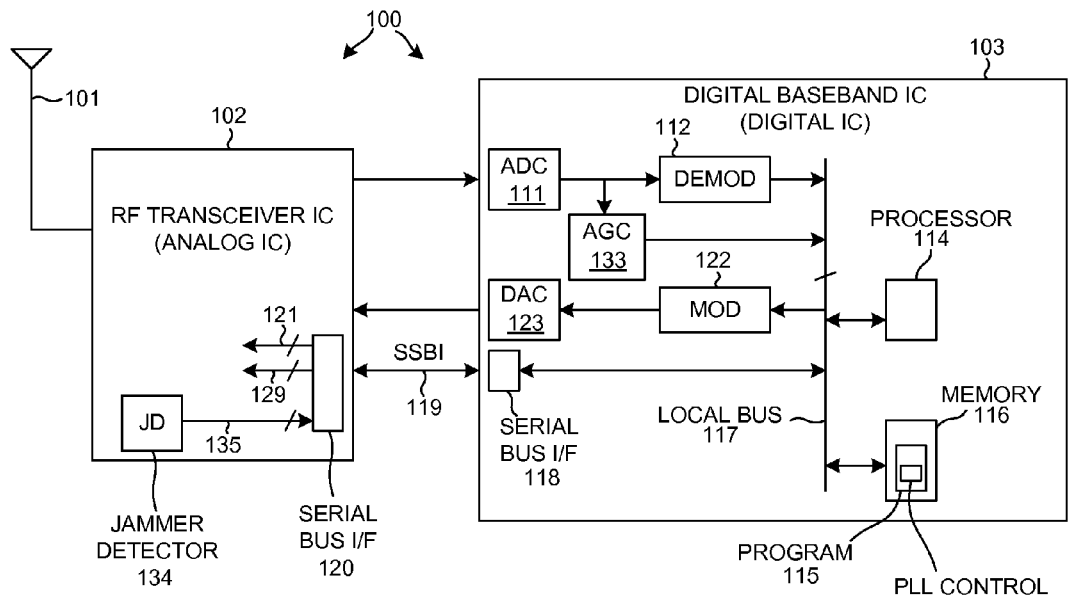
FIG. 5 is a simplified high level block diagram of one particular type of mobile communication device 100 in accordance with three aspects.

FIG. 5 is a very simplified high level block diagram of one particular type of mobile communication device 100 in accordance with one aspect. In this particular example, mobile communication device 100 is a cellular telephone. Mobile communication device 100 includes (among several other parts not illustrated) an antenna 101 and two integrated circuits 102 and 103. Integrated circuit 102 is an RF transceiver integrated circuit. RF transceiver integrated circuit 102 is called a "transceiver" because it includes a transmitter as well as a receiver. The term "transceiver," however, also applies to the overall circuit of the mobile communication device 100 because aspects of the receiver and transmitter are disposed in integrated circuit 103 as well as in integrated circuit 102. RF transceiver integrated circuit 102 is principally an analog integrated circuit involving analog circuitry. Integrated circuit 103, on the other hand, is principally a digital integrated circuit that includes digital circuitry. Integrated circuit 103 is called a "digital baseband integrated circuit" or a "baseband processor integrated circuit."

Figure 6:
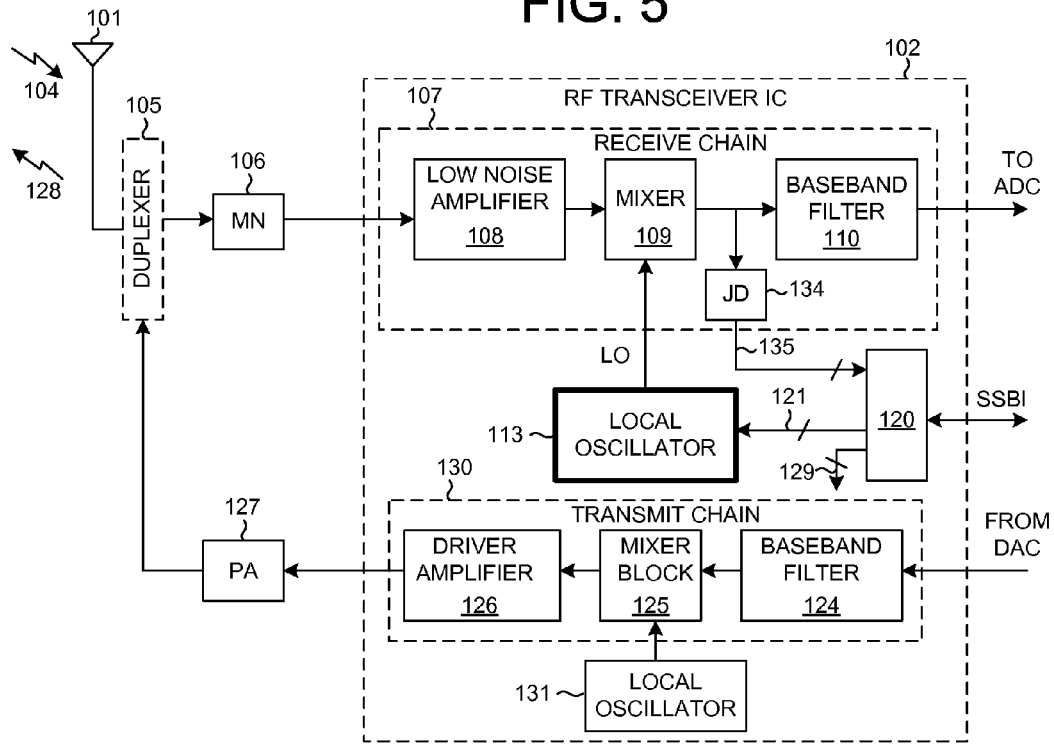
FIG. 6 is a more detailed block diagram of the RF transceiver integrated circuit 102 of FIG. 5.

FIG. 6 is a more detailed block diagram of the RF transceiver integrated circuit 102. When cellular telephone 100 is receiving, a high frequency RF signal 104 is received on antenna 101. Information from signal 104 passes through duplexer 105, matching network 106, and through the receive chain 107. The signal is amplified by Low Noise Amplifier (LNA) 108 and is down-converted in frequency by mixer 109. The resulting down-converted signal is filtered by baseband filter 110 and is passed to the digital baseband integrated circuit 103. An Analog-to-Digital Converter (ADC) 111 in digital baseband integrated circuit 103 converts the signal into digital form and the resulting digital information is processed by a demodulator hardware path 112 within digital baseband integrated circuit 103.

The receive chain 107 is tuned by controlling the frequency of a local oscillator signal LO supplied by a local oscillator 113. Local oscillator 113 is in turn controlled by a processor 114 in digital baseband integrated circuit 103 and a program of processor-executable instructions 115 stored in a processor-readable medium 116. Processor-readable medium 116 in this case is a semiconductor memory. Processor 114 can access memory 116 across local bus 117. To control local oscillator 113 of RF transceiver integrated circuit 102, processor 114 writes appropriate values into serial bus interface 118. The values then pass across a serial SSBI bus 119 to a serial bus interface circuit 120 of the RF transceiver integrated circuit 102 and appear on conductors 121. By changing these values communicated, processor 114 can change the local oscillator LO frequency, and can thereby tune the receive chain 107.

If the cellular telephone is transmitting, then information to be transmitted passes through modulator hardware path 122 within digital baseband integrated circuit 103, and is converted into analog form by a Digital-to-Analog Converter (DAC) 123. The resulting analog signal is supplied to "transmit chain" 130 of RF transceiver integrated circuit 102. Baseband filter 124 filters out noise introduced by the digital-to-analog conversion process. Mixer block 125 then up-converts the signal into a high frequency signal. Driver amplifier 126 and an external power amplifier 127 amplify the high frequency signal to drive antenna 101 so that a high frequency RF signal 128 is transmitted from antenna 101. Processor 114 tunes the transmit chain 130 by setting values on conductors 129 that in turn control local oscillator 131.

Figure 7:
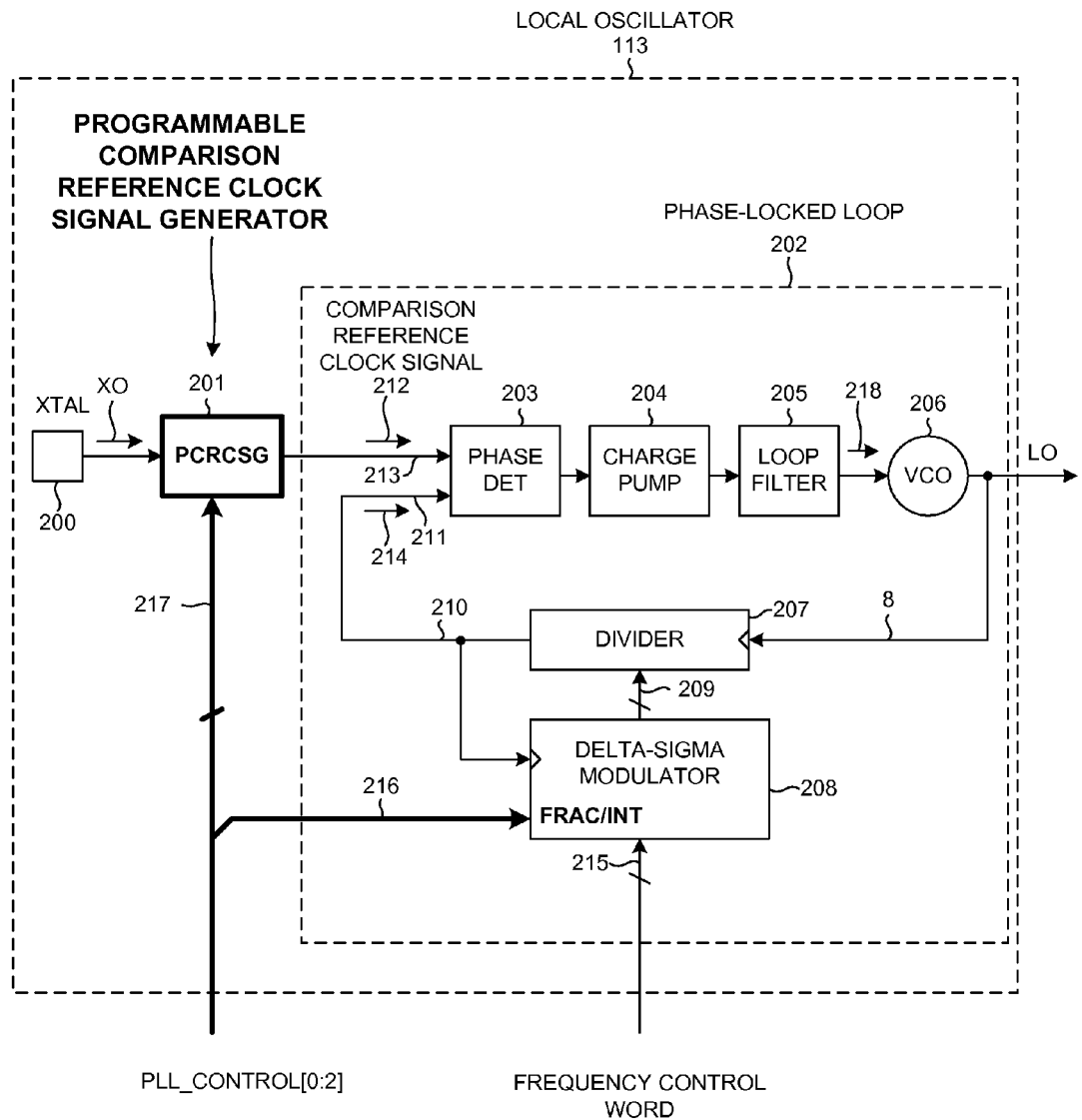
FIG. 7 is a block diagram of the local oscillator 113 of the RF transceiver integrated circuit 102 of FIG. 6.

FIG. 7 is a more detailed block diagram of local oscillator 113 of the receive portion of RF transceiver integrated circuit 102 of FIG. 6. Local oscillator 113 includes a source 200 of a stable reference clock signal XO, a Programmable Comparison Reference Clock Signal Generator (PCRCSG) 201, and a Phase-Locked Loop (PLL) circuit 202. Source 200 may be a crystal oscillator that is located in part on RF transceiver integrated circuit 103. Source 200 may also be another source from which the reference clock signal XO is received. In another example, source 200 is a conductor or conductors across which the reference clock signal XO is received.

Phase-locked loop circuit 202 is a phase-locked loop circuit that is operable either as a fractional-N phase-locked loop in a fractional-N mode, or as an integer-N phase-locked loop in an integer-N mode. Phase-locked loop circuit 202 includes a phase detector 203, a charge pump 204, a loop filter 205, a Voltage Controlled Oscillator (VCO) 206, a loop divider 207, and a delta-sigma modulator control circuit 208. Loop divider 207 receives the local oscillator output signal LO from the output of VCO 206 and frequency divides the LO signal by a divisor. The divisor is determined by a multi-bit digital value on conductors 209. The resulting frequency divided feedback signal 214 is supplied via conductor or conductors 210 to a second input 211 of phase detector 203. A comparison reference clock signal 212 output from PCRCSG 201 is supplied onto the first input 213 of phase detector 203. When PLL 202 is in lock, VCO 206 is controlled by a steering signal 218 such that the frequency and phase of the feedback signal 214 matches the frequency and phase of the comparison reference clock signal 212.

If PLL 202 is operating in its fractional-N mode, then delta-sigma modulator circuit 208 varies the multi-bit digital value on conductors 209 such that the divisor by which loop divider 207 divides is changed over time such that the average divisor is a fractional value. Any suitable sigma-delta modulator circuit or scheme known in the art can be employed. The fractional value is set by a multi-bit frequency control word received via conductors 215. Conductors 215 are some of the conductors 121 of FIGS. 5 and 6. Processor 114 can set this frequency control word by setting the value on conductors 121 as described above.

If, however, PLL 202 is operating in its integer-N mode, then delta-sigma modulator circuit 208 does not vary the value on conductors 209 in a delta-sigma modulated fashion but rather the value on conductors 209 is a fixed integer value. In one example, the fixed integer value is the value of the frequency control word on conductors 215. PLL 202 operates as an integer-N phase-locked loop, rather than as a fractional-N phase-locked loop. Whether PLL 202 operates as a fractional-N phase-locked loop or as an integer-N phase-locked loop is determined by the value of a digital FRAC/INT signal on conductor 216.

PCRCSG 201 is controllable to supply the comparison reference clock signal 212 to be of the same frequency as the reference clock signal XO, or to be of a related frequency. In the present example, PCRCSG 201 receives the reference clock signal XO of frequency 19.2 MHz, and outputs the comparison reference clock signal 212 of a frequency that is selectable to be one of: 19.2 MHz, 16.8 MHz, and 21.6 MHz. The particular frequency selected is determined by the multi-bit digital value PLL_CONTROL[0:2] received on conductors 217. The most significant bit PLL_CONTROL[3] is the FRAC/INT value supplied via conductor 216 to delta-sigma modulator circuit 208.

FIG. 8 is a table that illustrates a way that the value PLL_CONTROL[0:2] is determined in one embodiment. The PLL_CONTROL[0:2] value is an output value of a lookup function. The input values of the lookup function in this case include total receive power information, information on whether the carrier signal-to-noise ratio (C/N) is below a predetermined threshold, information on whether a jammer is detected, and transmit channel information. The output of the lookup function, the PLL_CONTROL[0:2] output value, determines whether PLL 202 operates as a fractional-N PLL or as an integer-N PLL, and also determines the frequency of the comparison reference clock signal 212.

Figure 1:
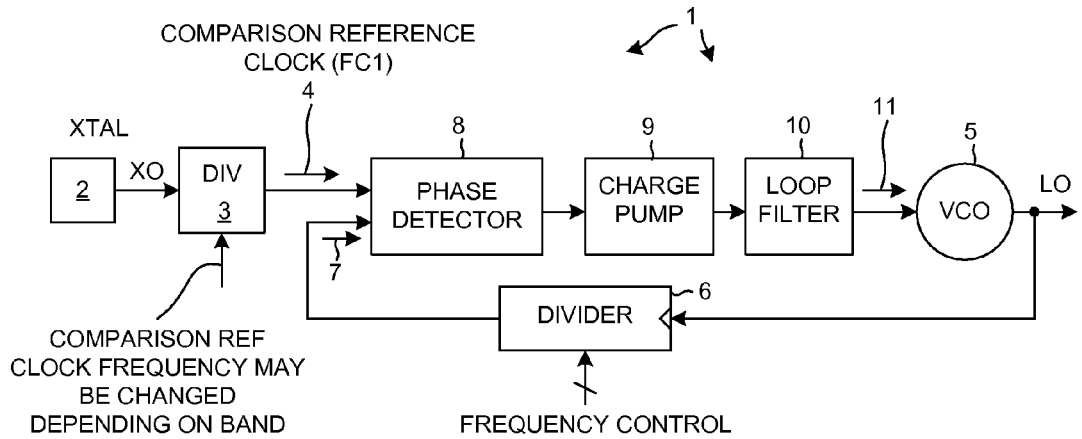
FIG. 1 (Prior Art) is a simplified diagram of a type of an integer-N Phase-Locked Loop (PLL).
Figure 2:
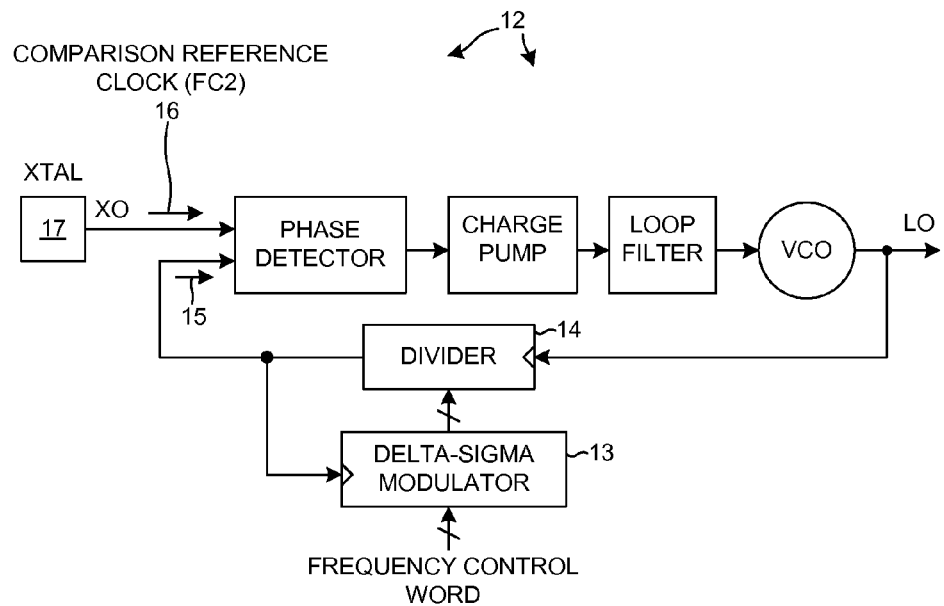
FIG. 2 (Prior Art) is a simplified diagram of a type of a fractional-N PLL.
Figure 9:
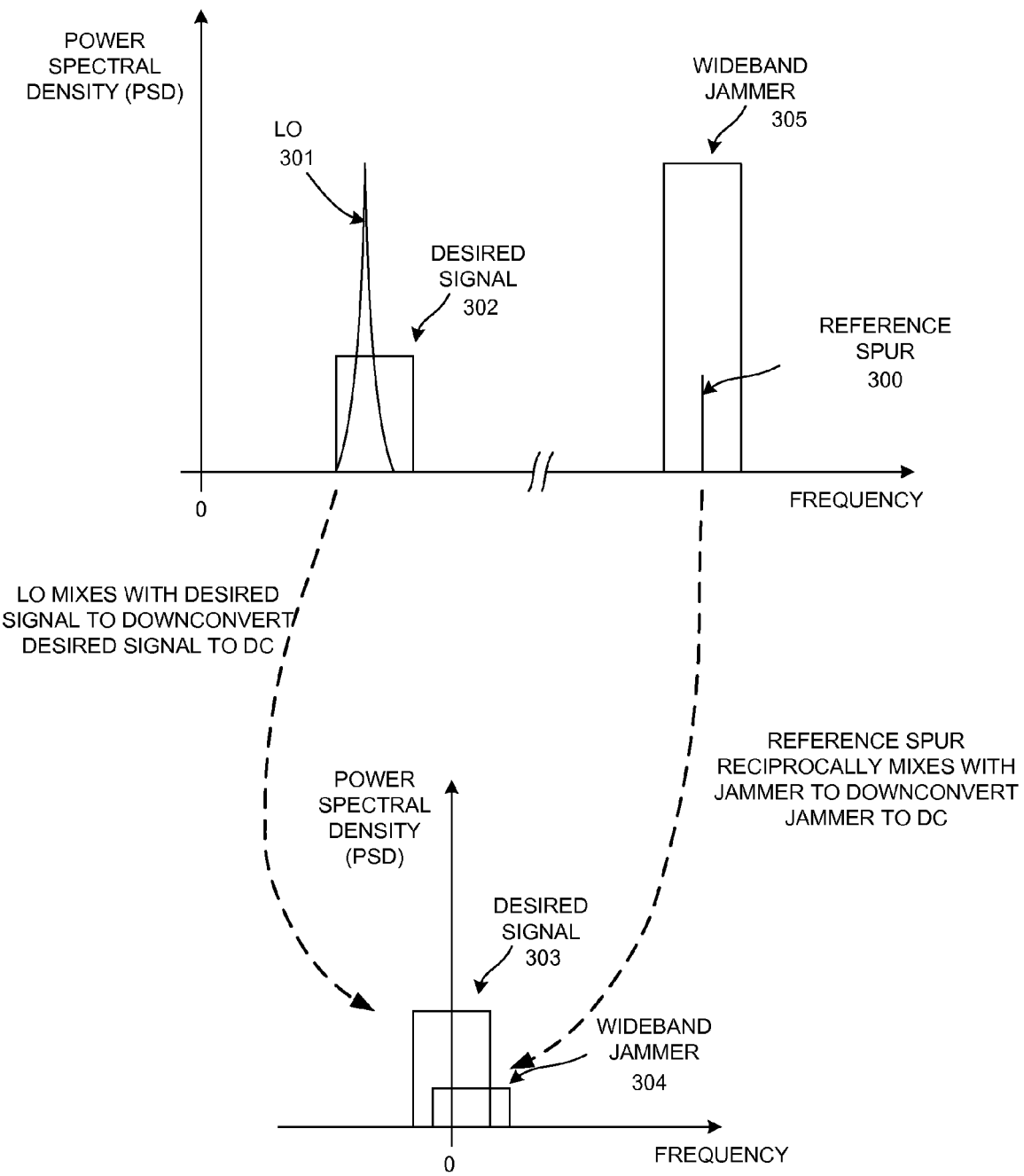
FIG. 9 is a diagram that illustrates a potential problem in which a reference spur generated by a fractional-N PLL of a local oscillator reciprocally mixes with transmitter leakage, thereby downconverting the transmitter leakage to baseband and obscuring the downconverted desired signal being received.

FIG. 9 is a diagram that illustrates a potential reciprocal mixing problem attendant in local oscillators involving fractional-N phase-locked loops such as the fractional-N PLL of FIG. 2. When the delta-sigma modulator of the PLL changes the divisor value supplied to the loop divider, there is change in the steering signal supplied to the Voltage Controlled Oscillator (VCO). The result is a change in phase of the LO signal as output by the VCO. Such LO phase changes occur at the comparison reference clock signal frequency and manifests themselves in the frequency domain as undesirable harmonic frequency components of the LO signal referred to here as "spurs" or "reference spurs." These reference spurs are produced in addition to the desired principal frequency component of the LO signal. One such reference spur is represented in FIG. 9 by reference numeral 300.

The LO signal is represented in FIG. 9 by reference numeral 301. The skirts of the LO signal 301 in the illustration represent phase noise. Block 302 in FIG. 9 represents an incoming wideband high frequency "desired signal" that is to be downconverted by the mixer of the receive chain to baseband. The frequency of the desired component of LO signal 301 is set such that the mixer downconverts the desired signal 302 to baseband at zero hertz. The resulting downconverted desired signal is illustrated by the block 303 in the lower portion of FIG. 9.

If the "reference spur" 300 due to fractional-N PLL operation has a proper frequency relationship with respect to another jammer signal 305, then it is possible that the mixer of the receiver will also reciprocally mix the reference spur 300 and the jammer 305 such that the jammer is downconverted in the frequency domain onto the downconverted version of the desired signal 303 at zero hertz, thereby obscuring the downconverted version of the signal 303. Block 304 in the lower portion of FIG. 9 illustrates a downconverted version of jammer 305. The downconverted jammer 304 is undesirable and obscures the downconverted version 303 of the desired signal.

In operation, the transmitter of mobile communication device 100 (FIG. 5) may be transmitting at the same time that the receiver of mobile communication device 100 is receiving. The transceiver of mobile communication device 100 is a full-duplex transceiver. Due to the strong transmission being output by the transmitter onto antenna 101 and due to the close proximity of the transmitter circuitry to the receiver circuitry within the mobile communication device 100, the transmitter signal may "leak" back into the receiver. Block 305 in the upper portion of FIG. 9 represents such transmitter leakage. As the transmit channel used by the transmitter is changed from one transmit channel to another transmit channel within a band, the frequency of the transmitter leakage also changes. When the frequency relationship between the transmitter leakage and the reference spur 300 is correct, the transmitter leakage is downconverted by reciprocal mixing as illustrated in FIG. 9. This is undesirable.

Figure 10:
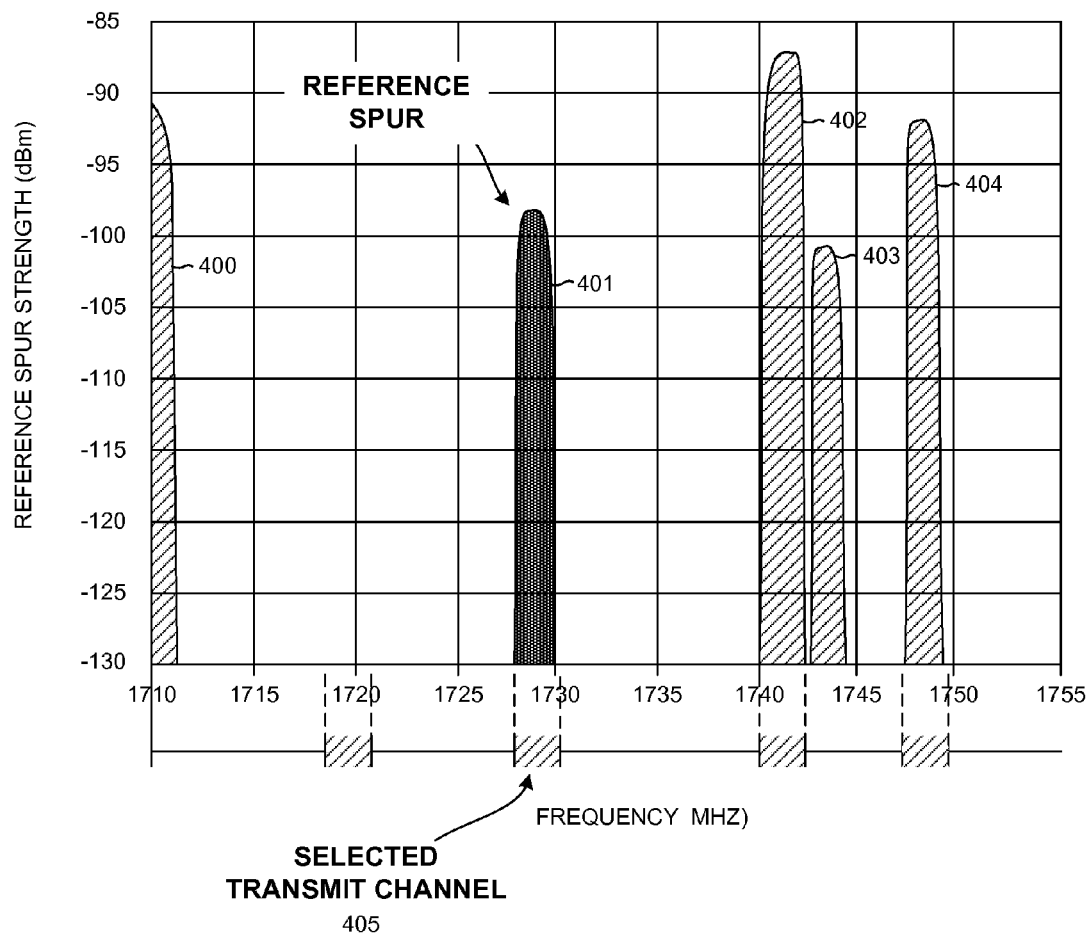
FIG. 10 is a diagram that illustrates how, if the comparison reference clock signal frequency is 19.2 MHz, a reference spur will be present at the same frequency as that of a selected transmit channel.
Figure 11:
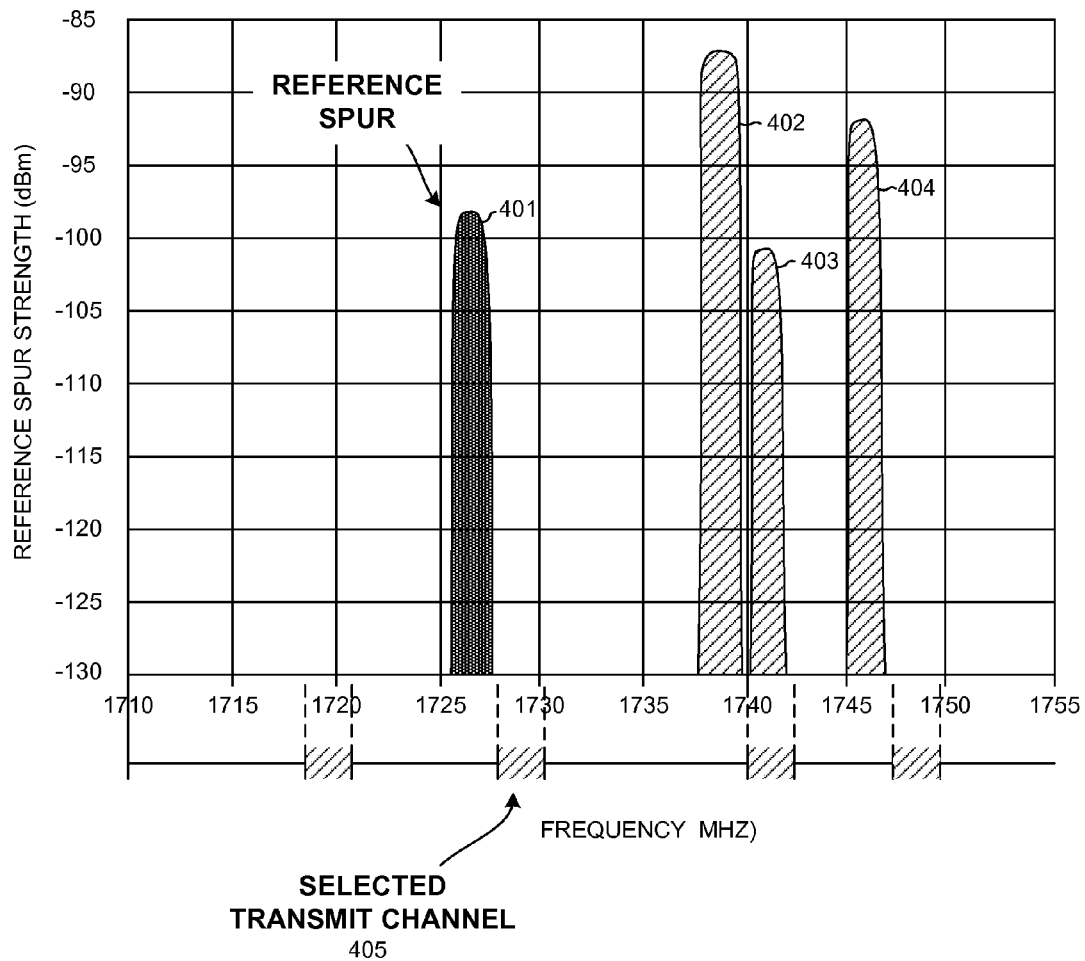
FIG. 11 is a diagram that illustrates how, if the comparison reference clock signal frequency is 16.8 MHz, the reference spur of FIG. 10 will now appear at a frequency different from the frequency of the selected transmit channel, thereby avoiding a reciprocal mixing problem.

FIGS. 10 and 11 are charts that illustrate how the system of FIGS. 5-7 avoids this reference spur reciprocal mixing problem. In FIG. 10, five spurs 400-404 are illustrated. Some of these reference spurs may be generated by the changing of the steering signal supplied to the VCO 206 as described above, whereas others of the spurs may be generated by other complex mechanisms.

As the legend of FIG. 10 indicates, the spurs illustrated would be present in the PLL of FIG. 7 if the comparison reference clock signal frequency were 19.2 MHz. Below the chart and extending in the horizontal direction are indicated four transmit channels. The four transmit channels have center frequencies of 1719 MHz, 1728 MHz, 1742 MHz, and 1748 MHz. When the transmitter is transmitting in one frequency band, the transmitter is made to transmit in a selected one of these transmit channels. Over time, the transmit channel used within the frequency band is made to change in accordance with known protocols employed.

Note that in the example of FIG. 10, reference spur 401 happens to overlap in frequency with the selected transmit channel 405. Transmit channel 405 is the transmit channel that the transmitter is to be using in this example. This situation may give rise to transmitter leakage and a reciprocal mixing problem with reference spur 401 as described above in connection with FIG. 9.

FIG. 11 illustrates an alternative situation in which the frequency of the comparison reference clock signal is 16.8 MHz, rather than 19.2 MHz. Note that due to the different frequency of the comparison reference clock signal, the spurs 401-404 are shifted down in frequency as compared to the location of the spurs 401-404 in FIG. 10. In FIG. 11, reference spur 401 does not overlap the selected transmit channel 405 in frequency as it did in FIG. 10. The potential reference spur reciprocal mixing problem of FIG. 10 is therefore avoided.

In a first aspect, reference spur reciprocal mixing problems such as the problem of FIG. 10 are avoided by studying the location and strengths of spurs given a selected transmit channel and a given comparison reference clock signal frequency. The analysis of spurs is made for each one of the selectable comparison reference clock signal frequencies (for example, 19.2 MHz, 16.8 MHz, or 21.6 MHz). For each possible selected transmit channel frequency, the frequency of the comparison reference clock signal is determined that results in minimal reciprocal mixing with known jammers and other harmful mechanisms that result in unwanted signals being downconverted to baseband. As the mobile communication device 100 of FIGS. 5-7 operates and as the transmit channel is changed, the frequency of the comparison reference clock signal 212 is dynamically changed as a function of transmit channel so that the selected frequency of the comparison reference clock signal 212 is such that the undesired reciprocal mixing (such as reciprocal mixing with transmit leakage) is minimized.

The PLL control lookup function illustrated in FIG. 8 determines the comparison reference clock signal frequency. Use of the PLL control lookup function involves use of the table 132 of FIG. 8 that is stored in memory 116 as illustrated in FIG. 5. The selected transmit channel (for example, 1719 MHz, 1728 MHz, 1742 MHz, and 1748 MHz) is known to processor 114 because the transmit channel assignment is communicated from the base station to the mobile communication device 100 as part of standard handshaking. Processor 114 uses the selected transmit channel information to consult the lookup table of FIG. 8 and to determine from the transmit channel information what the PLL_CONTROL[0:2] output value should be. As indicated in the fifth row of value in the table, if the transmit channel center frequency is 1728 MHz (and TOTAL RECEIVE POWER is greater than a predetermined threshold amount of −90 dBm), then the PLL_CONTROL[0:2] value is [101]. The value [101] sets PLL 202 of FIG. 7 in the fractional-N mode and causes PCRCSG 201 to output the comparison reference clock signal at 16.8 MHz, rather than 19.2 MHz. The "X" entries in the "C/N BELOW THRESH?" column and in the "JAMMER DETECTED AT RX FREQ?" column of FIG. 8 indicate "don't cares." The more desirable situation of FIG. 11 is therefore created for operation in the selected transmit channel of 1728 MHz, as opposed to the less desirable situation of FIG. 10.

Figure 12:
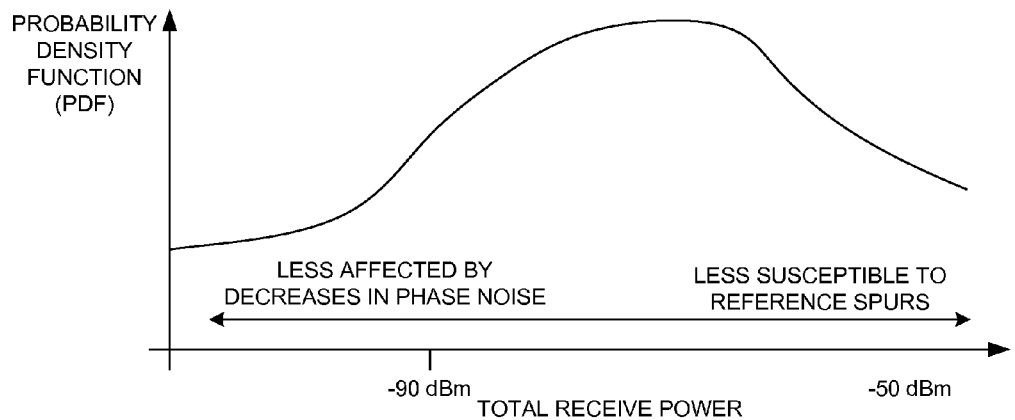
FIG. 12 is a diagram that illustrates how, at low total receive powers, receiver operation is less affected by decreases in phase noise than it is at higher total receive powers.

FIG. 12 illustrates a Probability Density Function (PDF) distribution curve as a function of total receive power. At higher total receive powers, the receiver of mobile communication device 100 is less susceptible to reference spurs, but is more susceptible to in-band phase noise. At lower powers, the receiver is more susceptible to reference spurs, but is less susceptible to in-band phase noise.

Figure 3:
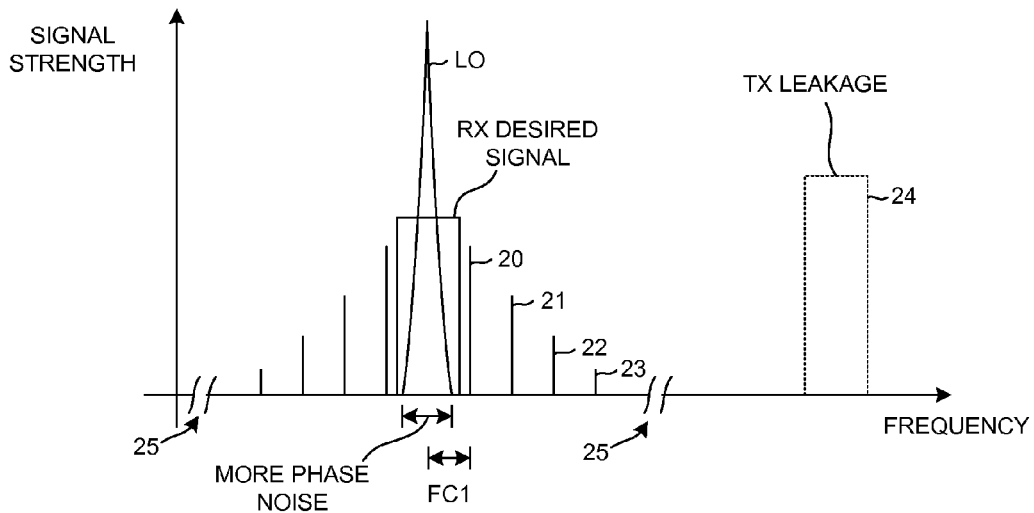
FIG. 3 (Prior Art) is a diagram that illustrates an operational characteristic of the integer-N PLL of FIG. 1.
Figure 4:
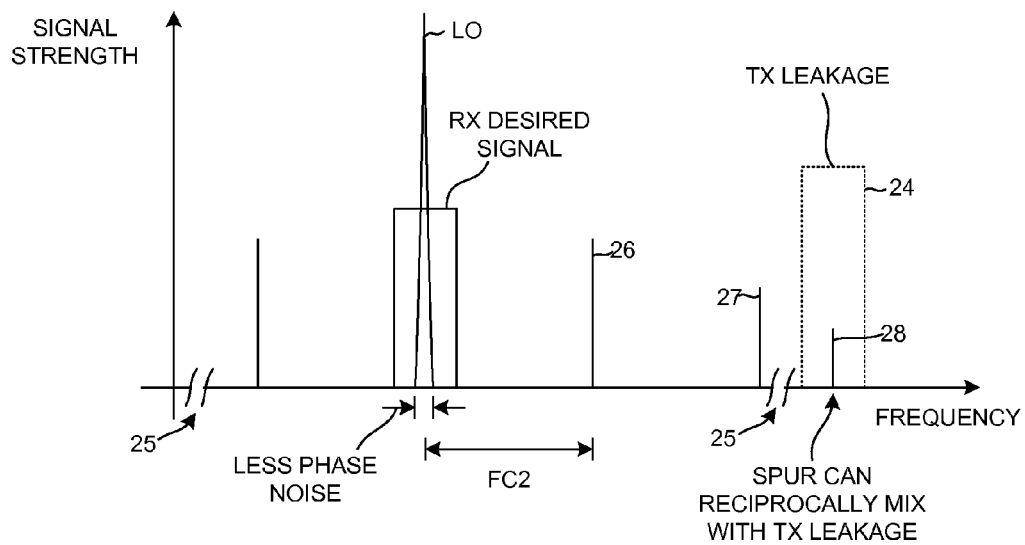
FIG. 4 (Prior Art) is a diagram that illustrates an operational characteristic of the fractional-N PLL of FIG. 2.
Figure 13:
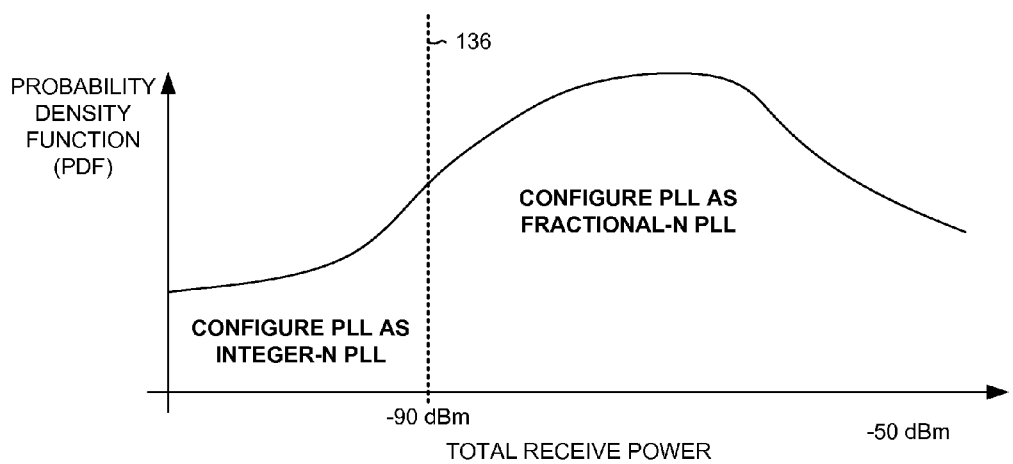
FIG. 13 is a diagram that illustrates a second aspect in which, at low total receive powers, the configurable PLL 202 of FIG. 7 is operated in its integer-N mode.

FIG. 13 illustrates a second aspect. It is recognized that at low receive power desirable quality of a fractional-N PLL generating low phase noise is typically not needed in the receiver because the signal-to-noise of the receiver is limited by thermal noise. At low receive powers, thermal noise is of higher magnitude that phase noise generated by the PLL. On the other hand, it is also recognized than at higher receive powers the low in-band phase noise characteristic of a fractional-N PLL is typically needed in the receiver to support high data rates. Accordingly, PLL 202 of FIGS. 3-5 is made to be a configurable PLL that is operable in a selectable one of a fractional-N mode and an integer-N mode. At total receive power levels below a predetermined threshold 136 (for example, below −90 dBm), PLL 202 is configured in the integer-N mode because receiver operation is susceptible to jamming from the reference spurs generated by a fractional-N PLL and because the receiver's signal-to-noise ratio is limited by thermal noise. At higher total receive powers above the threshold 136 (for example, above −90 dBm), however, PLL 202 is configured as a fractional-N PLL to take advantage of a fractional-N PLL generating less phase noise than an integer-N PLL. Toggling the configuration of PLL 202 between the fractional-N mode and the integer-N mode may perturb the LO frequency output by the PLL in an undesirable fashion. Disturbing receiver PLL operation too much in too small of an amount of time may cause problems. For example, a cellular telephone call involving the receiver may be dropped if the LO frequency is not adequately stable. In one aspect, the changing of modes of PLL 202 is limited to occur in a fashion that prevents the unwanted consequence of too rapid changing of modes. In the present example, processor 114 uses a timer (not shown) to limit the rate of PLL configuration changes such that the configuration is not toggled between fractional-N mode and integer-N mode at more than a predetermined maximum rate (for example, at most once each five second period).

FIG. 8 also illustrates how total receive power is used as an input value to the PLL control lookup function. As indicated by the upper row of values in the table of FIG. 8, if total receive power is less than −90 dBm then PLL 202 of FIG. 7 is configured as an integer-N PLL. The "TRANSMIT CHANNEL CENTER FREQUENCY" input value, the "JAMMER DETECTED AT RX FREQ?" input value, and the "C/N BELOW THRESH?" input value are "don't cares." If, however, the total receive power input value to the lookup function indicates a total receive power greater than −90 dBm, then PLL 202 of FIG. 7 is configured as a fractional-N PLL. An Automatic Gain Correction (AGC) block 133 in the receive channel path within digital baseband integrated circuit 103 measures total receive power and provides a multi-bit digital value indicative of the measured total receive power. Processor 114 reads this multi-bit digital value power across local bus 117 from AGC 133 and then uses the total receive power value as an input value to the PLL control lookup function.

FIG. 8 also illustrates a third aspect. RF transceiver integrated circuit 102 includes a jammer detector circuit 134. In one specific example, if jammer detector circuit 134 detects a jammer, then jammer detector circuit 134 send an interrupt signal to processor 114 via conductors 135, serial bus interface 120, serial bus 119, serial bus interface 118, and local bus 117. The interrupt signal may, for example, be received by an interrupt controller (not shown) that in turn supplies an interrupt signal to processor 114. Upon receiving the interrupt signal, processor 144 executes an interrupt service routine. The interrupt service routine causes processor 114 to read a multi-bit digital value in a register in jammer detector circuit 134. The multi-bit digital value indicates the frequency of the detected jammer as well as an indication of the strength of the detected jammer.

In the third aspect, this jammer detect information is used as an input value to the PLL control lookup function. If a jammer is detected adequately close to the allocated receive channel frequency and if the jammer detected is determined to be of adequate signal strength, then processor 114 determines that the "JAMMER DETECTED AT RX FREQ?" value is "YES", otherwise processor 114 determines that the "JAMMER DETECTED AT RX FREQ?" value is "NO." FIG. 8 illustrates how, in certain circumstances, the comparison reference clock frequency is determined by the "JAMMER DETECTED AT RX FREQ?" input value and the "C/N BELOW THRESH?" input value. As indicated in the second row of values of FIG. 8, if no jammer is detected and the assigned transmit channel is 1719 MHz, then the comparison reference clock signal has a frequency of 19.2 MHz. If, however, a jammer is detected (as indicated by the "JAMMER DETECTED AT RX FREQ?" input value being "YES") and the assigned transmit channel is the same 1719 MHz, then the comparison reference clock signal has a frequency that depends on the "C/N BELOW THRESH?" input value. The mechanisms giving rise to the jammer may not be known and the consequences of the jammer may not be fully anticipatable. Accordingly, in the present example, if the signal-to-noise ratio of the carrier signal (C/N) is not below a predetermined threshold, then it is determined that receiver operation is not adequately compromised to warrant changing the comparison reference clock signal frequency from the standard 19.2 MHz. Note that in the third row of values in the table of FIG. 6 the "COMP. REF. CLOCK FREQ" value is 19.2 MHz. If, however, the signal-to-noise ratio of the carrier signal (C/N) is below the predetermined threshold, then it is determined that circumstances warrant using a comparison reference clock signal frequency other than 19.2 MHz. Note that in the fourth row of values of FIG. 6 the "COMP. REF. CLOCK FREQ" value is 16.8 MHz. In one example, after the receiver has operated for a time with the comparison reference clock signal frequency being 16.8 MHz, processor 114 reads jammer detector 134 again to determine if the originally detected jammer has been reduced in magnitude. Processor 114 also determines the magnitude of the carrier signal-to-noise ratio (C/N). If the use of the 16.8 MHz comparison reference clock signal frequency resulted in better receiver operation than previous use of a 19.2 MHz comparison reference clock signal frequency, then in the future when the 1719 MHz transmit channel is used the 16.8 MHz comparison reference clock signal frequency will be used. Otherwise, if the use of the 16.8 MHz comparison reference clock signal frequency did not result in better receiver operation, then in the future when the 1719 MHz transmit channel is used the 19.2 MHz comparison reference clock signal frequency will be used. Accordingly, receiver operation is assessed using two or more different comparison reference clock signal frequencies under the same transmit channel assignment condition. The resulting receiver operation assessments are then compared used to determine which comparison reference clocks signal frequency will be used in certain circumstances in the future.

Figure 14:
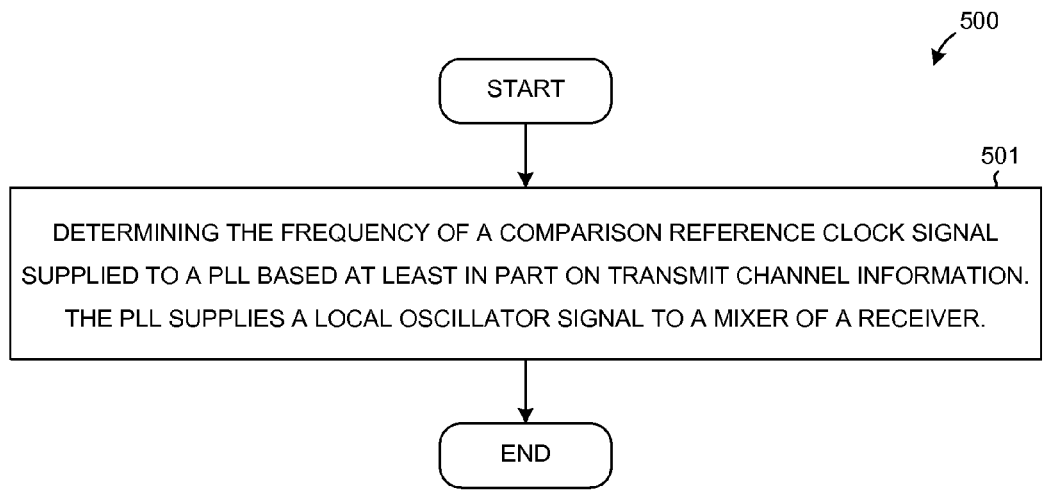
FIG. 14 is a simplified flowchart of a method in accordance with the first aspect.

FIG. 14 is a simplified flowchart of a method 500 in accordance with the first aspect. In step 501, the frequency of a comparison reference clock signal supplied to a PLL is determined based at least in part on transmit channel information. The PLL supplies a local oscillator signal to a mixer of a receiver. In one example of the method, the transmit channel information is a channel assignment (channel assignment information) received onto mobile communication device 100 of FIG. 5 from a base station. The transmit channel assignment information may identify a transmit channel without identifying a receiver channel. Alternatively, the transmit channel assignment may identify both a transmit channel and a receive channel. The comparison reference clock signal is comparison reference clock signal 212 of FIG. 7. The determining of step 501 involves consulting the PLL control value lookup function (represented by the table of FIG. 8) and selecting a PLL control value.

Figure 15:
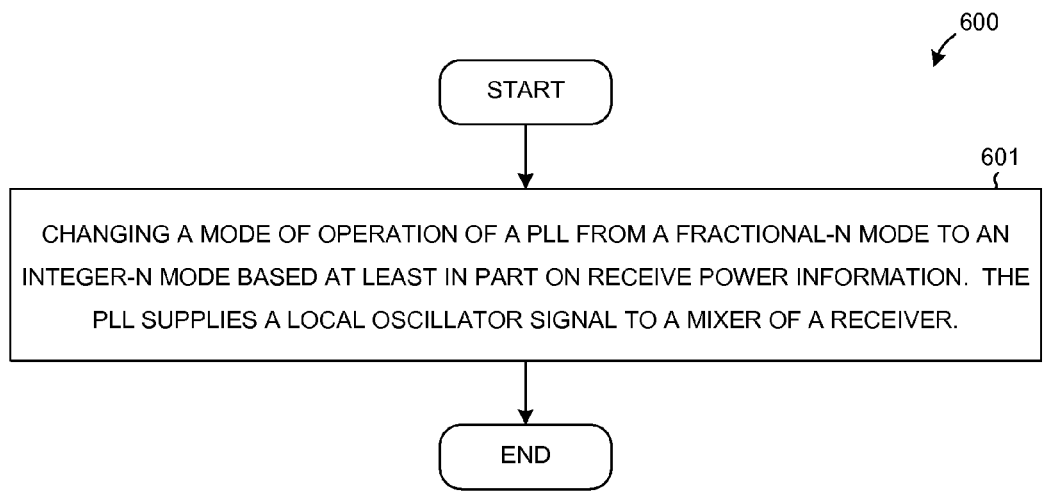
FIG. 15 is a simplified flowchart of a method in accordance with the second aspect.

FIG. 15 is a simplified flowchart of a method 600 in accordance with the second aspect. In step 601, a mode of operation of a PLL is changed from a fractional-N mode to an integer-N mode based at least in part on receive power information. The PLL supplies a local oscillator signal to a mixer of a receiver. In one example of the method, receive power information is received from AGC block 133 of the digital baseband integrated circuit 103 of FIG. 5. The receive power information may be a total receive power value.

Figure 16:
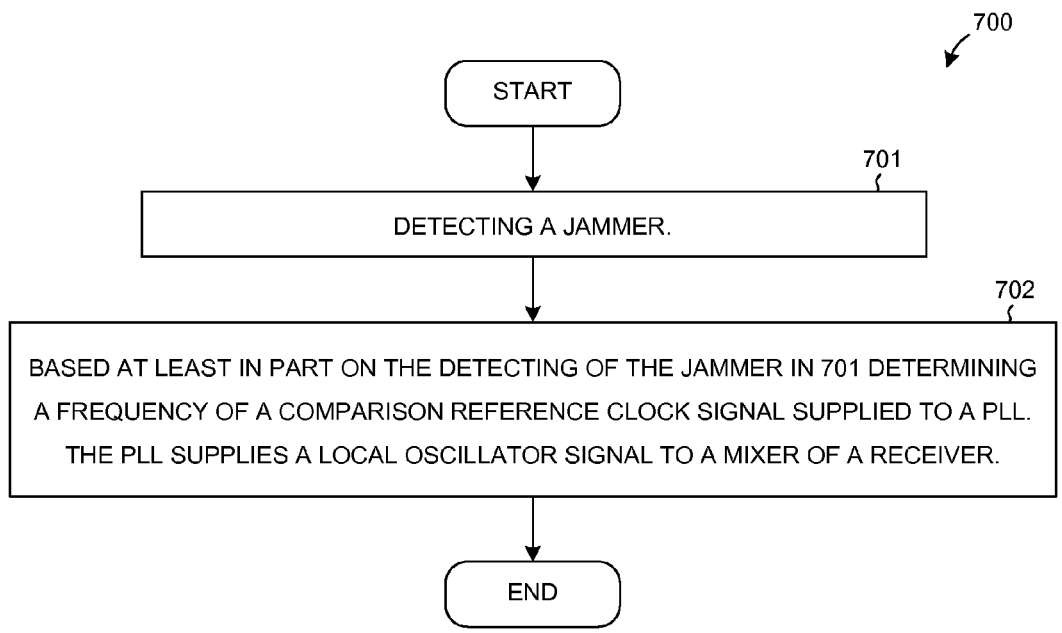
FIG. 16 is a simplified flowchart of a method in accordance with the third aspect.

FIG. 16 is a simplified flowchart of a method 700 in accordance with the third aspect. In step 701, a jammer is detected. In step 702, a frequency of a comparison reference clock signal supplied to a PLL is determined based at least in part on the detecting of the jammer in step 701. The PLL supplies a local oscillator signal to a mixer of a receiver. In one example of the method, the jammer is detected by jammer detector circuit 134 of FIGS. 5 and 6. The determining of step 701 involves consulting the PLL control value lookup function represented by the table of FIG. 8 and selecting a PLL control value.

Figure 17:
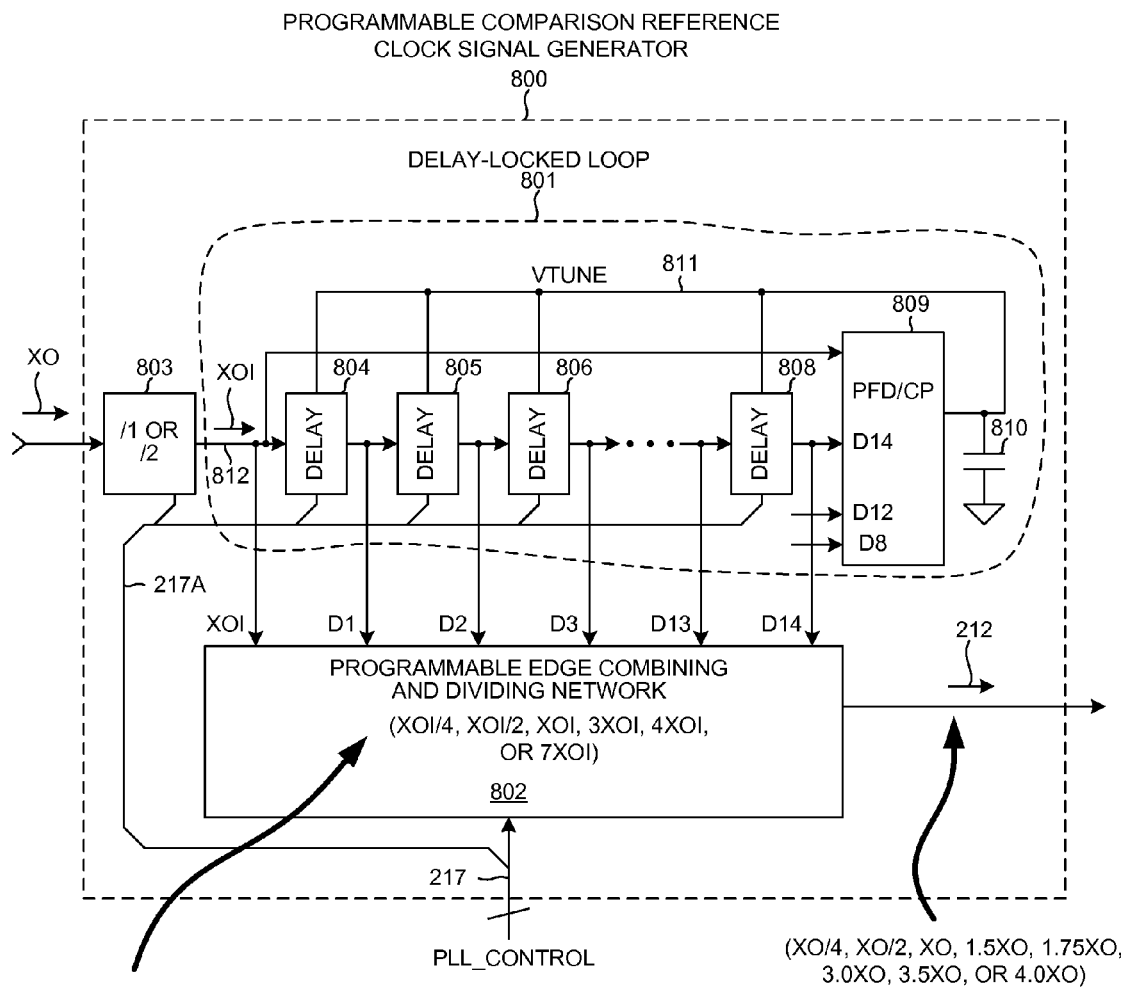
FIG. 17 is a block diagram of one particular example of a Programmable Comparison Reference Clocks Signal Generator.

FIG. 17 is a circuit diagram of one example of a Programmable Comparison Reference Clock Signal Generator (PCRCSG) 800. In one embodiment of the local oscillator of FIG. 7, the PCRCSG 800 of FIG. 17 is a more detailed diagram of a PCRCSG of FIG. 7. PCRCSG 800 includes a programmable divider 803, a Delay-Locked Lop (DLL) 801 and a programmable edge combining and dividing network 802. Programmable divider 803 receives the incoming clock signal XO and outputs signal XOI onto node 812. Signal XOI is either a buffered version of the incoming signal XO or is the XO signal divided down in frequency by two. Whether programmable divider 803 frequency divides by two or does not frequency divide is determined by the digital control value on control lines 217A.

DLL 801 includes, in this particular example, fourteen programmable delay elements 804-808 (only four of the fourteen delay elements are illustrated), a phase-frequency detector and charge pump portion (PFD/CP) 809, and a smoothing capacitor 810. Each programmable delay element provides a programmable even number of CMOS inverters in the signal path through the programmable delay element. The even number may, for example, be two, four, or six as determined by digital control values on control lines 217A. DLL 801 operates such that the total series propagation delay through the programmable delay elements 804-808 is locked to be one period of the incoming signal XOI on node 812. Within each programmable delay element, one or more of the inverters includes a P-channel head switch in addition to the P-channel and N-channel transistors of an ordinary CMOS inverter. The head switch is disposed in the supply voltage current path into the source of the P-channel transistor of the CMOS inverter. The conductor 811 supplies the VTUNE voltage onto the gates of the P-channel head switches to control the delays through the programmable delay elements 804-808. Because the delays through the programmable delay elements 804-808 are identical, the rising and falling edges of the incoming signal XOI on node 812 are delayed by one fourteenth, one twelfth, or one eights of the period of XOI by delay element 804 (signal D1), are delayed by two fourteenths, two twelfths, or two eights of the period of XOI by delay elements 804 and 805 (signal D2), are delayed by three fourteenths, three twelfths, or three eights of the period of XOI by delay elements 804, 805 and 806 (signal D3), and so forth. If block 802 is frequency multiplying by three then there are twelve programmable delay elements in the signal path of signal XOI back to PFD/CP 809; whereas if block 802 is frequency multiplying by four then there are eight programmable delay elements in the signal path of signal XOI back to PFD/CP 809; whereas if block 802 is frequency multiplying by seven then there are fourteen programmable delay elements in the signal path of signal XOI back to PFD/CP 809.

Programmable edge combining and dividing network 802 includes an amount of combinatorial logic that combines signal XOI and the delay signals D1-D14 such that the comparison output reference clock signal 212 has a selectable frequency. The frequency of output reference clock signal 212 is equal to one of the following: 1) the frequency of the incoming XOI signal, 2) three times the frequency of the XOI signal, 3) four times the frequency of the XOI signal, or 4) seven times the frequency of the XOI signal. Three combinatorial logic equations for generating signal 212 from the signals XOI and D1-D14 are set forth in FIG. 17. The programmable edge combining and dividing network 802 also includes a divide-by-two circuit and a divide-by-four circuit that can, depending on the configuration of network 802, frequency divide the output of the combinatorial logic.

In one configuration, PCRCSG 800 outputs signal 212 having a frequency of one quarter the frequency of incoming signal XO. To do this, programmable divider 803 frequency divides XO by two, and programmable edge combining and dividing network frequency 802 divides XOI by two.

In another configuration, PCRCSG 800 outputs signal 212 having a frequency of one half the frequency of incoming signal XO. To do this, programmable divider 803 frequency divides XO by two, and programmable edge combining and dividing network 802 outputs signal XOI in unchanged form.

In another configuration, PCRCSG 800 outputs signal 212 having a frequency of the frequency of incoming signal XO. To do this, programmable divider 803 does not frequency divide, and programmable edge combining and dividing network 802 outputs signal XOI in unchanged form.

In another configuration, PCRCSG 800 outputs signal 212 having a frequency equal to 1.5 times the frequency of incoming signal XO. To do this, programmable divider 803 does not frequency divide, the combinatorial edge combining logic of programmable edge combining and dividing network 802 generates a signal having a frequency of three times the frequency of XOI, and the divide-by-two circuit in the programmable edge combining and dividing network 802 frequency divides this signal by two to generate the signal 212.

In another configuration, PCRCSG 800 outputs signal 212 having a frequency equal to 1.75 times the frequency of incoming signal XO. To do this, programmable divider 803 frequency divides by two, the combinatorial edge combining logic of programmable edge combining and dividing network 802 generates a signal having a frequency of seven times the frequency of XOI, and the divide-by-two circuit in the programmable edge combining and dividing network 802 frequency divides the output of the combinatorial logic by two to generate the signal 212.

In another configuration, PCRCSG 800 outputs signal 212 having a frequency equal to 3.0 times the frequency of incoming signal XO. To do this, programmable divider 803 does not frequency divide, the combinatorial edge combining logic of programmable edge combining and dividing network 802 generates a signal having a frequency of three times the frequency of XOI and outputs this signal as signal 212.

In another configuration, PCRCSG 800 outputs signal 212 having a frequency equal to 3.5 times the frequency of incoming signal XO. To do this, programmable divider 803 frequency divides by two, and the combinatorial edge combining logic of programmable edge combining and dividing network 802 generates a signal having a frequency of seven times the frequency of XOI, thereby generating the signal 212.

In another configuration, PCRCSG 800 outputs signal 212 having a frequency equal to 4.0 times the frequency of incoming signal XO. To do this, programmable divider 803 does not frequency divide, the combinatorial edge combining logic of programmable edge combining and dividing network 802 generates a signal having a frequency of four times the frequency of XOI and this resulting signal is output as signal 212.

The configuration of PCRCSG 800 is determined by multi-bit digital control value PLL_CONTROL on conductors 217. The number of inverters (two, four or six) in the signal paths through each delay element is each configuration is determined by the PLL control lookup table or function such that the tuning range of the DLL 801 for the particular operating conditions is optimized.

The techniques described herein may be implemented by various means. For example, these techniques may be implemented in hardware, firmware, software, or a combination thereof. For a hardware implementation, the processing units used to perform the techniques at an entity (e.g., in a mobile communication device) may be implemented within one or more Application Specific Integrated Circuits (ASICs). Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, electronic devices, other electronic units designed to perform the functions described herein, a computer, or a combination thereof. For a firmware and/or software implementation, the techniques may be implemented with code (e.g., programs, routines, procedures, modules, functions, instructions, etc.) that performs the functions described herein. In general, any computer/processor-readable medium tangibly embodying firmware and/or software code may be used in implementing the techniques described herein. For example, the firmware and/or software code may be stored in a memory (e.g., memory 116 of FIG. 5) and executed by a processor (e.g., processor 114 of FIG. 5). The memory may be implemented within the processor or may be external to the processor. The firmware and/or software code may also be stored in a computer/processor-readable medium such as Random Access Memory (RAM), Read-Only Memory (ROM), Non-Volatile Random Access Memory (NVRAM), Programmable Read-Only Memory (PROM), Electrically Erasable PROM (EEPROM), FLASH memory, floppy disk, Compact Disc (CD), Digital Versatile Disc (DVD), magnetic or optical data storage device, etc. The code may be executable by one or more computers/processors and may cause the computer/processor(s) to perform certain aspects of the functionality described herein.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A method comprising:
   generating a comparison reference clock signal having a first frequency;
   supplying the comparison reference clock signal to a Phase-Locked Loop (PLL) configured to provide a local oscillator signal to a mixer of a transceiver;
   in response to detecting a jammer at a jammer frequency within a predetermined frequency value of a transceiver receive channel frequency, wherein the jammer is at a signal strength above a predetermined level, providing a signal to the PLL to change the first frequency of the comparison reference clock signal to a second frequency when a carrier signal to noise ratio is below a predetermined threshold; and
   returning the comparison reference clock signal to the first frequency, after the transceiver has operated for a time period using the comparison reference clock signal at the second frequency, in response to a determination that the jammer signal strength has not been reduced in magnitude.

2. The method of claim 1, further comprising detecting the jammer by determining that the first frequency has a specific frequency relationship with a spur associated with a transmit signal.

3. The method of claim 2, wherein the specific frequency relationship comprises a frequency overlap associated with respective power spectral densities of the comparison reference clock signal and the spur.

4. The method of claim 1, wherein the transceiver transmits a transmit signal and the transmit signal includes transmit channel information, the transmit channel information indicating one or more of a transmit channel associated with the transmit signal, channel assignment information identifying the transmit channel, and channel assignment information that identifies the transmit channel and a receive channel.

5. The method of claim 1, further comprising determining a plurality of frequencies of the comparison reference clock signal each corresponding to a respective transmit channel of a plurality of transmit channels of a transmit band.

6. The method of claim 5, wherein the transceiver transmits a transmit signal, the method further comprising:
   changing the transmit signal from a first transmit channel of the plurality of transmit channels to a second transmit channel of the plurality of transmit channels; and
   changing the comparison reference clock signal from the second frequency to a third frequency, the third frequency associated with the second transmit channel.

7. The method of claim 6, wherein the second frequency is associated with a frequency overlap with the second transmit channel, and wherein the third frequency is not associated with a frequency overlap with the second transmit channel.

8. The method of claim 1, further comprising accessing a lookup table to determine the second frequency.

9. The method of claim 8, wherein the lookup table includes PLL control information.

10. The method of claim 8, further comprising receiving a receive signal identifying transmit channel information, wherein the lookup table is accessed in response to receiving the receive signal.

11. The method of claim 1, wherein the comparison reference clock signal has the first frequency for a first amount of time when a transmitter is transmitting in a first transmit channel of a transmit band, and wherein the comparison reference clock signal has the second frequency for a second amount of time when the transmitter is transmitting in a second transmit channel of the transmit band.

12. The method of claim 1, further comprising selecting between a fractional-N mode of the PLL and an integer-N mode of the PLL.

13. The method of claim 12, further comprising accessing a lookup table based on transmit channel information to output PLL control information, wherein the PLL control information determines whether the PLL operates according to the fractional-N mode or according to the integer-N mode.

14. The method of claim 1, further comprising generating a reference clock signal at a crystal oscillator, wherein the comparison reference clock signal is generated based on the reference clock signal.

15. A circuit comprising:
a Phase-Locked Loop (PLL) configured to supply a local oscillator signal to a mixer of a transceiver;
a Programmable Comparison Reference Clock Signal Generator (PCRCSG) configured to supply a comparison reference clock signal to the PLL, wherein the comparison reference clock signal has a first frequency; and
a lookup circuit configured to supply PLL control information to the PCRCSG based on transmit channel information;
wherein the transceiver is configured to transmit a transmit signal according to the transmit channel information,
wherein the PCRCSG is configured to change the first frequency of the comparison reference clock signal to a second frequency based on the PLL control information;
wherein the transmit channel information comprises a jammer frequency being within a predetermined frequency value of a receive channel frequency of the transceiver, a jammer signal strength being above a predetermined level, and a carrier signal to noise ratio being below a predetermined threshold;
wherein the PCRCSG is configured to return the comparison reference clock signal to the first frequency, after the transceiver has operated for a time period using the comparison reference clock signal at the second frequency, in response to a determination that the jammer signal strength has not been reduced in magnitude.

16. The circuit of claim 15, transceiver is configured to receive a signal that includes the transmit channel information.

17. The circuit of claim 15, wherein the transmit channel information includes channel assignment information, and wherein the channel assignment information identifies the transmit channel.

18. The circuit of claim 15, wherein the transmit channel information includes channel assignment information, and wherein the channel assignment information identifies the transmit channel and a receive channel.

19. The circuit of claim 15, wherein the transmit channel is one of a plurality of transmit channels of a transmit band.

20. The circuit of claim 15, further comprising a processor and a set of processor-executable instructions stored on a processor-readable medium.

21. A circuit comprising:
a jammer detection circuit configured to generate an interrupt signal in response to detecting a jammer and further configured to output at least one value indicating a frequency of the detected jammer is within a predetermined frequency value of a receive channel frequency, a strength of the detected jammer is above a predetermined level, and a carrier signal to noise ratio is below a predetermined threshold;
a lookup circuit configured to generate phase-locked loop control information responsive to the at least one value; and
a Phase-Locked Loop (PLL) of a local oscillator of a receiver, the PLL being configured to change a clock signal from a first frequency to a second frequency based on the phase-locked loop control information;
wherein the PLL is configured to return the clock signal to the first frequency, after the PLL has operated the clock signal for a time period at the second frequency, in response to a determination that the strength of the detected jammer has not been reduced in magnitude.

22. The circuit of claim 21, further comprising a first integrated circuit and a second integrated circuit, wherein the first integrated circuit includes the lookup circuit, wherein the second integrated circuit includes the PLL, and wherein the first integrated circuit is coupled to supply the phase-locked loop control information to the second integrated circuit.

23. A computer program product, comprising:
a computer-readable tangible medium comprising instructions executable by a processor to cause the processor to:
execute an interrupt service routine responsive to receiving an interrupt, wherein the interrupt service routine includes reading at least one value stored in a register, the at least one value indicating a frequency of a detected jammer is within a predetermined frequency value of a receive channel frequency, a strength of a detected jammer is above a predetermined level, and a carrier signal to noise ratio is below a predetermined threshold; and
change a frequency of a comparison reference clock signal to be provided to a phase-locked loop (PLL), wherein the frequency is changed from a first frequency to a second frequency based on the at least one value;
wherein the instructions are executable by the processor to cause the processor to return the comparison reference clock signal to the first frequency, after operating the comparison reference clock signal for a time period at the second frequency, in response to a determination that detected jammer signal strength has not been reduced in magnitude.

24. The computer program product of claim 23, wherein the instructions are further executable by the processor to cause the processor to supply phase-locked loop control information to the PLL based on the at least one value.

25. The computer program product of claim 24, wherein the instructions are further executable by the processor to maintain a lookup table of values associated with respective frequencies of the comparison reference clock signal to be provided to the PLL.

26. An apparatus comprising:
means for transmitting a transmit signal;
means for generating a local oscillation signal based on a comparison reference clock signal;
means for detecting a jammer associated with the transmit signal; and
means for changing a frequency of the comparison reference clock signal from a first frequency to a second frequency based on a jammer frequency being within a predetermined frequency value of a receive channel frequency of the means for transmitting, a jammer signal strength being above a predetermined level, and a carrier signal to noise ratio being below a predetermined threshold;

wherein the means for changing the frequency is configured to return the comparison reference clock signal to the first frequency, after the means for transmitting has operated for a time period using the comparison reference clock signal at the second frequency, in response to a determination that the jammer signal strength has not been reduced in magnitude.

27. The apparatus of claim 26, further comprising means for storing a plurality of values each corresponding to a respective one of a plurality of frequencies of the comparison reference clock signal, wherein the means for storing the plurality of values is responsive to values output by the means for detecting the jammer.

28. The apparatus of claim 27, wherein the means for storing the plurality of values comprises a lookup table.

29. The apparatus of claim 26, wherein the means for changing the frequency of the comparison reference clock signal includes a processor, a serial bus, and a programmable comparison reference clock signal generator.

30. The apparatus of claim 26, wherein the means for generating the local oscillation signal comprises a Phase-Locked Loop (PLL) operable in a selectable one of a fractional-N mode and an integer-N mode.

31. A mobile device comprising:
a phase locked loop (PLL) coupled to generate a local oscillation signal based on a comparison reference clock signal;

a jammer detection circuit coupled to generate a signal in response to detecting a jammer having a jammer frequency within a predetermined frequency value of a receive channel frequency and a jammer signal strength above a predetermined level, and a carrier signal to noise ratio being below a predetermined threshold; and a processor responsive to the signal to select at least one value of a lookup table of values, the processor determining whether the PLL operates according to a fractional mode corresponding to a first frequency or according to an integer mode corresponding to a second frequency and further changing a frequency of the comparison reference clock signal from the first frequency to the second frequency based on the at least one value;

wherein the processor is configured to return the comparison reference clock signal to the first frequency, after operating the comparison reference clock signal for a time period at the second frequency, in response to a determination that detected jammer signal strength has not been reduced in magnitude.

32. The mobile device of claim 31, wherein the processor uses a timer responsive to a change of mode of the PLL until enabling a next change of mode of the PLL, wherein the change of mode is associated with one of changing from integer operation to fractional operation and changing from fractional operation to integer operation, and wherein the next change of mode is associated with the other of changing from integer operation to fractional operation and changing from fractional operation to integer operation.

* * * * *